United States Patent [19]
Barnett

[11] Patent Number: 5,557,214
[45] Date of Patent: Sep. 17, 1996

[54] MICRO BEAM PROBE SEMICONDUCTOR TEST INTERFACE

[76] Inventor: C. Kenneth Barnett, 45640 Parkmeadow Ct., Fremont, Calif. 94539

[21] Appl. No.: 384,001

[22] Filed: Feb. 6, 1995

[51] Int. Cl.[6] .............................. G01R 1/73; H01R 43/00
[52] U.S. Cl. .................................... 324/762; 29/884
[58] Field of Search ........................ 324/762, 754, 324/158.1; 29/874, 884

[56] References Cited

U.S. PATENT DOCUMENTS

| | | | |
|---|---|---|---|
| 3,446,065 | 5/1969 | Wiesler et al. | 324/762 |
| 3,648,169 | 3/1972 | Wiesler | 324/158.1 |
| 3,851,249 | 11/1974 | Roch | 324/762 |
| 4,116,523 | 9/1978 | Coberly et al. | 324/762 |

Primary Examiner—Ernest F. Karlsen

[57] ABSTRACT

Apparatus is disclosed for interfacing a semiconductor test circuit and a semiconductor device under test, wherein the interface is a silicon structure test probe having conductor paths which extend along cantilevered parallelogram micro beams having contact bumps on the free ends of the beams arranged in a pattern which registers with a test pad pattern on the semiconductor device under test. The parallelogram beams provide test pad contact with substantially no scrubbing action. The silicon structure provides testing over wide environmental ranges because the test probe structure reacts to environmental conditions in the same way as the silicon semiconductor device under test. A method for fabricating the silicon structure test probe is disclosed which includes fabrication in the silicon structure of semiconductor circuit drivers and receivers for the conducting paths.

19 Claims, 4 Drawing Sheets

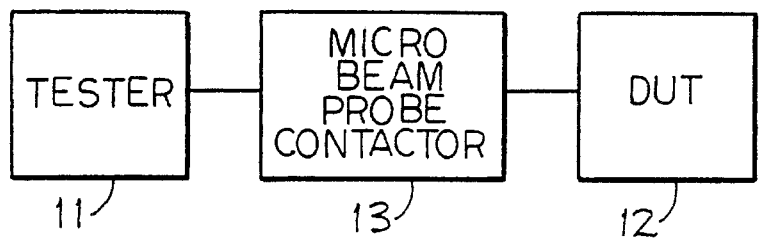
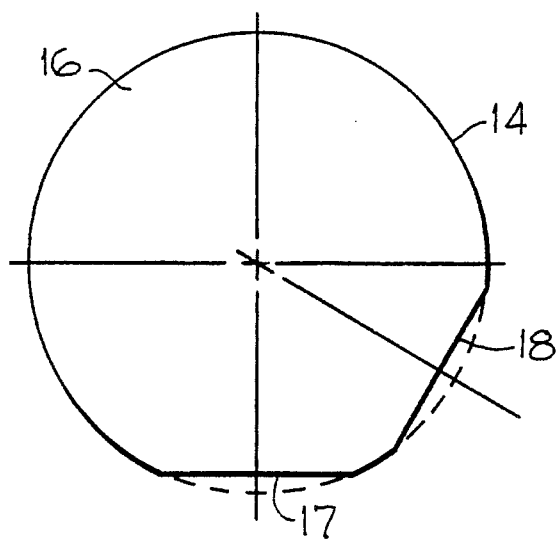
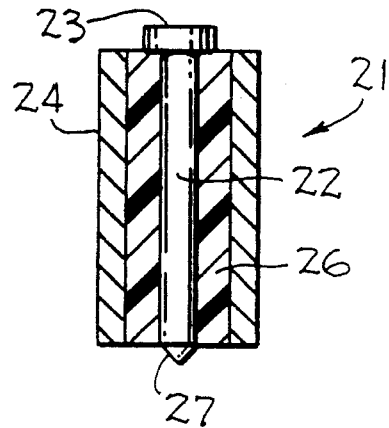
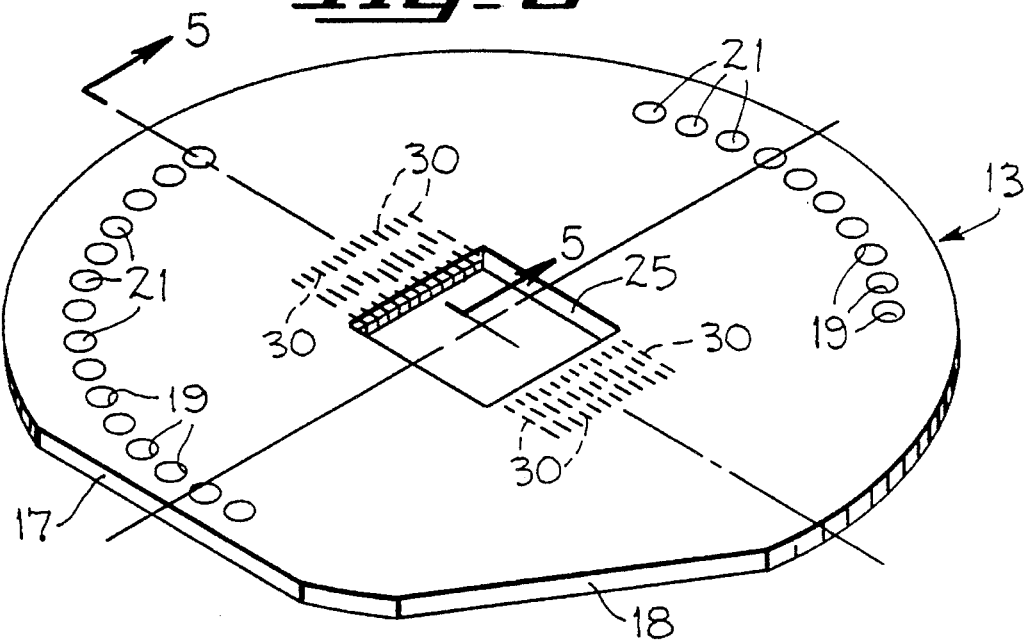

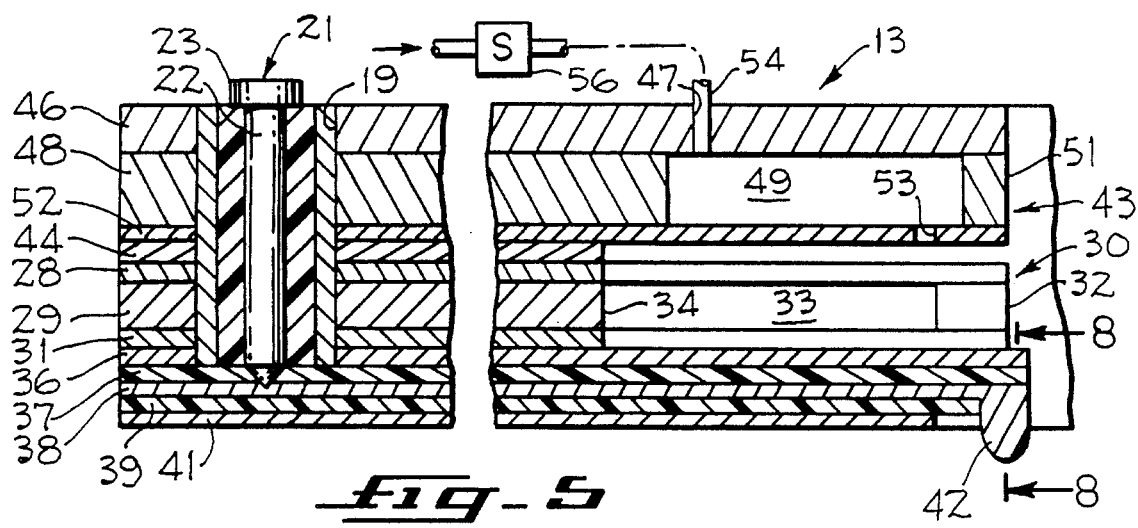
fig_5
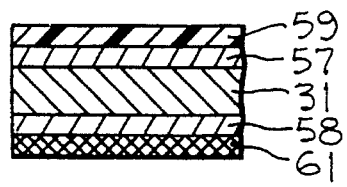
fig_6A
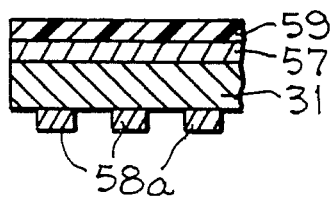
fig_6B
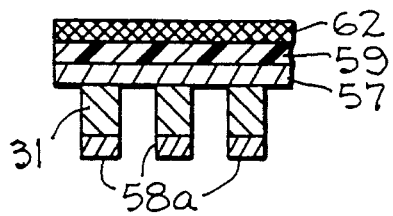
fig_6C
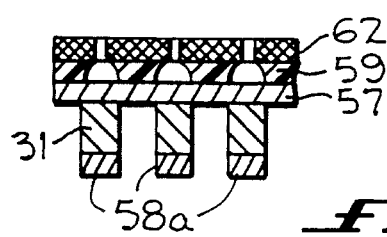
fig_6D
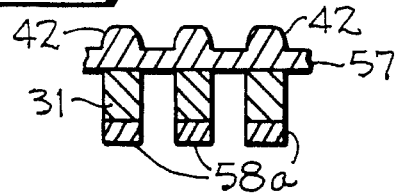
fig_6E
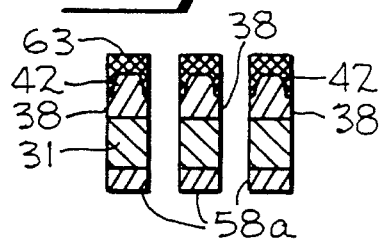
fig_6F

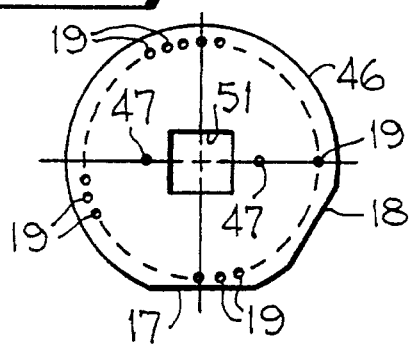
fig_7A
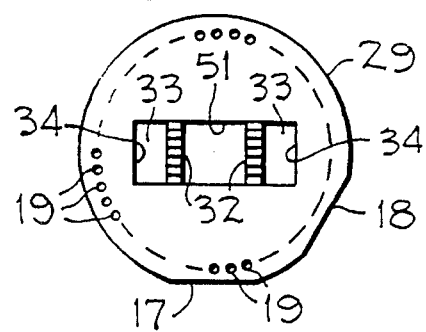
fig_7E
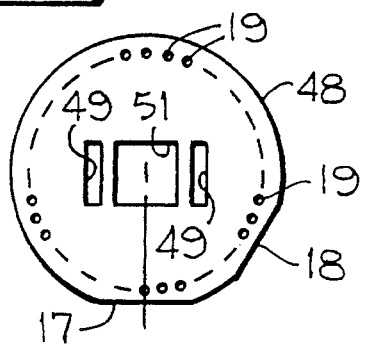
fig_7B
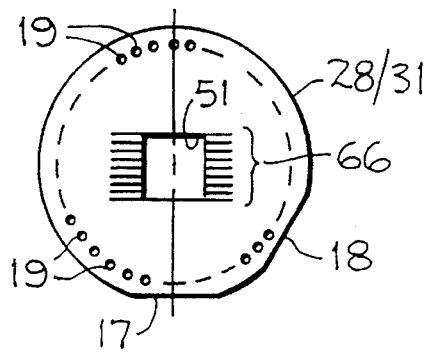
fig_7F
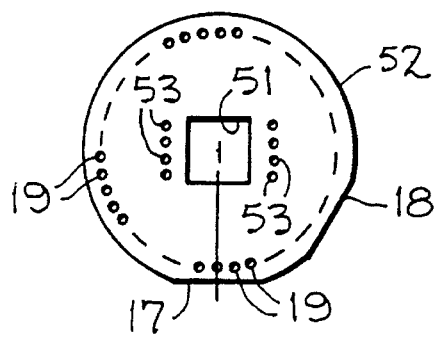
fig_7C
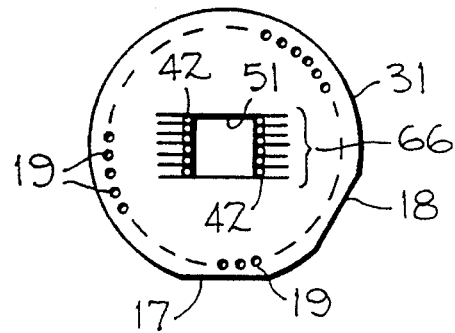
fig_7G
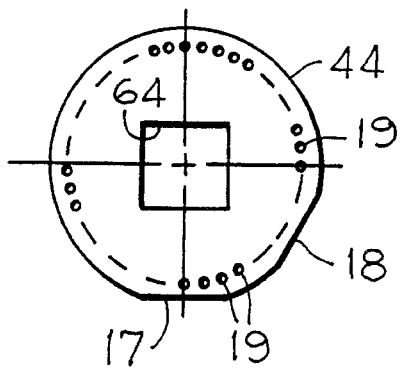
fig_7D
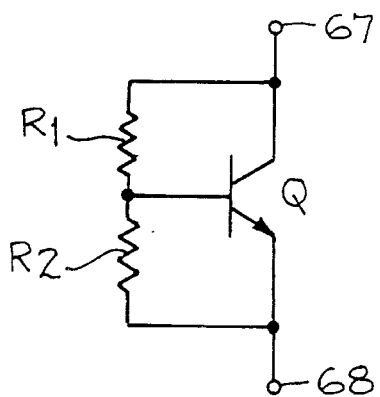
fig_8

fig_8A
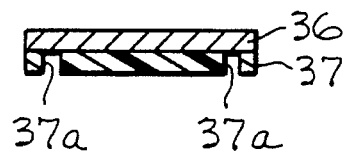
fig_8B
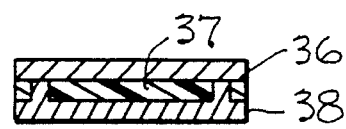
fig_8C
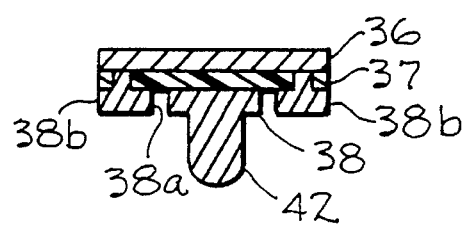
fig_8D
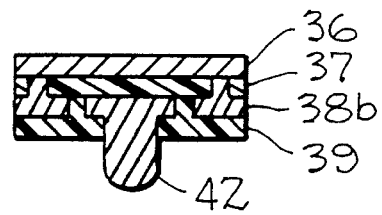
fig_8E
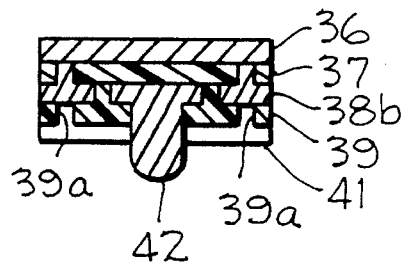
fig_8F

MICRO BEAM PROBE SEMICONDUCTOR TEST INTERFACE

SUMMARY OF THE INVENTION

This invention relates to a micro beam probe for positioning and electrically interfacing between a semiconductor tester and a semiconductor device to be tested, wherein the semiconductor device has a predetermined pattern of test pads thereon and wherein the semiconductor tester has a plurality of accessible test circuit terminals. A plurality of cantilevered parallelogram beams have free ends and fixed ends with the free ends of the beams being disposed for motion in a direction toward and away from the pattern of test pads on the semiconductor device to be tested. The motion is obtained through bending of the parallelogram beams. A plurality of test pad contacts are attached to the free ends of the beams and are arrayed in a pattern which is in registration with the predetermined pattern of semiconductor test pads. A plurality of tester connection contacts is provided for electrical connection to the plurality of accessible test circuit terminals. A plurality of electrical conductors extend between individual ones of the plurality of tester connection contacts and individual ones of the plurality of test pad contacts. Means is provided for shielding the plurality of electrical conductors and means is also provided for providing mechanical support for the plurality of electrical conductors, the means for shielding and the parallelogram beam fixed ends.

In another aspect of the invention a micro beam test probe is provided for interfacing a semiconductor tester having a plurality of accessible tester terminals with a semiconductor device under test. The semiconductor device has a predetermined array of test pads. A beam assembly has a plurality of cantilevered parallelogram beams which have fixed ends and free ends. The beam assembly has an opening therethrough and the free ends of the parallelogram beams lie along the periphery of the opening. A beam sensor means overlies the beam assembly for sensing bending of the cantilevered parallelogram beams toward the beam sensor means from an initial beam position. The beam sensor means has an opening therethrough also, wherein the opening is aligned with the beam assembly opening. A plurality of tester contacts is mounted in the beam assembly means for connection with the accessible tester terminals. A plurality of test pad contacts is attached to ones of the cantilevered parallelogram beam free ends in a pattern which is in registration with the predetermined array of test pads. Conductor means is provided for electrically connecting ones of the test pad contacts with ones of the tester contacts. Shielding extends along the conductor means.

In yet another aspect of the invention a micro beam test probe is provided for interfacing a semiconductor tester having a plurality of accessible test circuit terminals with a semiconductor device under test, wherein the semiconductor device has a predetermined array of test pads thereon. A probe body has substantially planar upper and lower surfaces and an opening is through the planar surfaces. A plurality of cantilevered beams having beam upper and lower layers extends from the probe body upper and lower surfaces. The cantilevered beams have fixed ends attached to the probe body and free ends extending to the edge of the opening. A beam ending means connects the beam upper and lower layers at the free ends of the beams. The cantilevered beams have a void between the upper and lower layers extending from the beam ending means to the beam fixed ends. A plurality of test circuit contacts is provided for electrical connection to the accessible test circuit terminals. A plurality of test pad contacts is provided on the beam lower layer at the free ends of the plurality of cantilevered beams. The plurality of test pad contacts is arranged in a pattern in registration with the predetermined array of test pads. A plurality of conductor paths extends between ones of the plurality of test circuit contacts and ones of the plurality of test pad contacts.

The invention also relates to a shielded conducting path for use in a via having a predetermined length, wherein the via extends through a body portion of a probe tester and the probe tester has a plurality of controlled impedance conducting paths and is used to interface a test circuit and a semiconductor device under test. The probe tester has shielded conductors extending from a plurality of probe contacts, which serve to contact a plurality of semiconductor device test pads. An elongate conductor has a length sufficient to extend through the via and a metallic shield surrounds the elongate conductor. Insulation means is disposed between the elongate conductor and the metallic shield. An upper contact is formed on the elongate conductor for connection to the test circuit. A lower contact is formed on the elongate conductor for providing pressure contact with ones of the shielded conductors.

The invention further relates to a method of fabricating a micro beam probe for interfacing a semiconductor test circuit having accessible test circuit contacts with a semiconductor device having a predetermined array of test pads. The process includes the steps of locating the (110) and ($\bar{1}11$) planes in a silicon crystal. The step of locating the ($\bar{1}11$) plane in the silicon crystal is followed by cutting a major orientation flat on the edge of the crystal along the ($\bar{1}11$) plane. Thereafter the ($\bar{1}11$) plane in the silicon crystal is located and a minor orientation flat is cut on the edge of the crystal along the ($1\bar{1}1$) plane. Wafers are cut from the crystal with the flats cut thereon, wherein the wafers are cut with the planar surfaces thereof parallel to the (110) plane. Registered patterns are masked and etched on an upper and a lower wafer in predetermined orientation with the orientation flats, whereby etched walls are orthogonal to the (110) plane. The patterns include a central opening, a plurality of cantilevered beams having free ends along the edge of the opening, and a plurality of vias proximate to the wafer peripheries. Thereafter a spacer wafer is attached to one side of the etched upper wafer with the orientation flats in alignment and the spacer wafer is masked and etched to form an opening therein which is in registration with the central opening and to remove all of the spacer wafer overlying the cantilevered beams except an end block at each beam free end. A metal is deposited on the lower side of the lower wafer and the wafer is masked and etched to form conductor paths extending from the free ends of the cantilevered beams to ones of the peripheral vias. Metal contact bumps are formed on the free ends of the beams. The cantilevered beams on the upper and lower wafers are aligned and the upper side of the lower wafer is attached to the accessible side of the etched spacer wafer. Test circuit terminals are formed which are adapted to receive the test circuit contacts and the conductor paths are connected through the vias with the test circuit terminals.

BRIEF DESCRIPTION OF THE DRAWINGS

FIG. 1 is a block diagram showing the use of the micro beam probe semiconductor test interface of the present invention.

FIG. 2 is a plan view of a silicon wafer used in the construction of the present invention.

FIG. 3 is a perspective view of the micro beam probe semiconductor test interface of the present invention.

FIG. 4 is a section through a test circuit contact for use in the micro beam probe of the present invention.

FIG. 5 is a section along the line 5—5 of FIG. 3.

FIGS. 6A through 6F depict the process steps in the fabrication of the lower parallelogram beam layer in the present invention.

FIGS. 7A through 7G show the formation of some of the silicon layers in the micro beam probe of the present invention.

FIG. 8 is a schematic diagram of a circuit useable as a driver or receiver.

FIGS. 8A through 8F are sections along the line 8—8 of FIG. 5 and show alternative process steps in the fabrication of the lower parallelogram beam layer of the present invention.

DESCRIPTION OF THE PREFERRED EMBODIMENT

Integrated circuits or devices are tested as early as possible in the manufacturing sequence after their formation on a semiconductor wafer. This may be in the wafer stage, after the devices are cut from the wafer, during burn-in, after burn-in, at final test prior to packaging, after packaging, etc. Since each post circuit formation manufacturing step represents an additional investment in the circuit, early determination of circuit integrity represents economy.

Testers for integrated circuits are known. They may be used to conduct tests under ambient conditions or at any number of environmental condition combinations. The block diagram of FIG. 1 shows such an integrated circuit tester 11 and a semiconductor circuit depicted as a device under test (DUT) 12. It is necessary to efficiently couple the tester 11 with the DUT 12 over a wide variety of environmental conditions (i.e., high and low temperatures) while preventing interference with the test signals as well as damage to the DUT. Further, it is important that the coupling device itself have a long useful life and be readily aligned for accurate contact with the DUT. Such a coupling device is seen as the micro beam probe and contactor (MBP) 13 in FIG. 1 situated between the tester and DUT.

The efficiency of the coupling of the tester 11 and the DUT 12 is obtained by providing appropriate impedance matching between the tester and the MBP and between the DUT and the MBP. Looking into the output of the tester 11, impedance is in the range of 50 to 100 ohms. Looking into the input of the DUT the impedance is in the same range. Test frequencies range from DC to 2 gigahertz for is analog testing and digital circuits require sub nanosecond rise times. The impedance at the input and at the output of MBP 13 must be therefore in the 50 to 100 ohm range to accommodate these test signals. The spacing between the signal path and the ground planes, the dielectric constant of the insulation, and the routing of the signal paths are the major influencing factors in the determination of conductor path impedance. This impedance may be calculated using the formula, $$ZO = 138 \sqrt{e} \ (Log10 \ D/d)$$

where e is the dielectric constant, D is the inside diameter of the outer conductor in a shielded path and d is the outside diameter of the inner conductor in the path. The MBP 13 of the present invention to be described herein is therefore provided with controlled input and output impedance within the 50 to 100 ohm range over the aforementioned test frequency range and widely varying environmental conditions such as −200° to +200° C. temperature range. In addition the MBP 13 of the present invention is formed by a unique process, is alignable visually with a DUT having test contact pads spaced as closely as 50 micrometers on pad centers, and provides negligible pad contact damage from pad as scrubbing by the MBP contacts.

MBP 13 is constructed of silicon or other materials with similar or matching temperature coefficients of expansion using photo lithography and thin film techniques. In order to obtain the vertical walls through etching on certain portions of the MBP structure it is necessary to align the images during MBP fabrication with the crystal lattice of the silicon. This is done by placing very accurately positioned flats on the silicon ingot prior to slicing it into wafers from which the MBP is made. A major orientation flat 17 is aligned with the ($\bar{1}11$) plane of the silicon crystal and is shown perpendicular to plane (110). A minor orientation flat 18 is aligned with the ($1\bar{1}1$) plane and orthogonal to the (110) plane. The planes are located in the grown crystal with X-rays in a fashion known to those in the crystal growing art. The flats are cut on the crystal within plus or minus ¼ degree tolerance to indicate the ($\bar{1}11$) and ($1\bar{1}1$) planes and the wafers are then cut parallel to the (110) crystalline plane. These wafers 14 are used to construct the MBP 13 of the present invention using the unique process to which reference was earlier made.

Turning to FIG. 3 of the drawings, a perspective view is shown of one form the invention described herein will take. A number of layers of processed silicon wafers 14 are shown in a final configuration to form the micro beam probe semiconductor test interface 13. A number of holes or vias 19 are formed through the micro beam probe in a fashion to be hereinafter described, wherein each of the vias has inserted therethrough a shielded test circuit contact 21. The shielded test circuit contact is shown in section in FIG. 4 wherein an elongate conductor 22 has a length sufficient to extend through the length of each of the vias 19. There is an upper contact 23 on one end of the elongate conductor 22 which is configured to be connected to the circuit tester 11 through the accessible tester terminals thereon.

The micro beam probe semiconductor test interface 13 has a centrally disposed opening 25 extending therethrough which serves as a viewing port for aligning the micro beam probe to a pattern of test pads on a semiconductor device 12 under test. A plurality of fingers 30 are shown in dashed lines in FIG. 3 since they reside at the undersurface of the micro beam probe 13. The fingers 30 extend to the edge of the opening 25 and are shown in FIG. 3 as extending to opposite sides of a substantially square opening. The fingers 30 are the micro beams of the present invention having free ends at the periphery of the opening 25.

A metallic shield 24 surrounds the elongate conductor 22, as seen in FIG. 4, wherein the shield is generally of some metallic material. Insulation 26 is disposed between the elongate conductor 22 and the metallic shield 24 and a lower contact 27 is provided on the end of the elongate conductor opposite the end carrying the upper contact 23. The lower contact 27 is configured to provide pressure contact between the elongate conductor 22 and ones of the conductor paths extending from the free ends of the parallelogram micro beams to be hereinafter described.

The section of FIG. 5 taken through the micro beam probe 13 will now be described. It should be noted that the relative thickness dimensions shown in FIG. 5 are only approximate, wherein certain layers are shown in greater thickness dimension for clarity in describing the locations and relative positions of the various layers. A test circuit contact 21 is shown extending through one of the vias 19 located near the periphery of the micro beam probe 13 and extending downwardly in FIG. 5 through the layered assembly. An upper micro beam layer 28 is placed on top and attached to the upper surface of a micro beam spacer layer 29. A lower micro beam layer 31 is attached to the bottom surface of the micro beam spacer 29. Spacer 29 is formed to provide an end block 32 extending between the upper and lower micro beam layers 28 and 31 and to have a void 33 extending from the end block 32 to an edge 34 of the spacer layer 29. As a result, when micro beams or fingers 30 (shown in dashed lines in FIG. 3) are formed, by a process to be hereinafter described, the fingers extend from a root end or fixed end at the edge 34 of the micro beam spacer 29 to the free or movable end of the micro beam at the end where the micro beam end block 32 is positioned.

The aforementioned assembly of upper micro beam layer 28, lower micro beam layer 31, micro beam spacer 29 and end block 32 are in each of the fingers 30 and form the cantilevered parallelogram beams or fingers 30. The beams extend from the root or fixed end at 34 to the free end at the end blocks 32 and may be seen in FIG. 5 to have an upper side (layer 28), a lower side (layer 31), a left side (edge 34) and a right side (end block 32) whereby the void 33 is bounded by a rectangle. When the micro beam or finger 30 has its free end moved up or down, thereby bending the cantilevered beam, the beam assumes a substantially parallelogram shape, which thereby restricts the free end of the micro beam to a substantially vertical movement as seen in the FIG. 5. By way of illustration of this, the empirical data of Table 1 is set forth here.

TABLE 1

TABLE 1

| VERTICAL TRAVEL μM | HORIZONTAL TRAVEL μM |
| --- | --- |
| 5.0 | <0.2 |
| 10.0 | <0.2 |
| 20.0 | <0.2 |
| 30.0 | <0.2 |
| 40.0 | <0.2 |
| 50.0 | <0.2 |
| 75.0 | <0.3 |
| 100.0 | <0.5 |

The normal travel for the micro beam 30 has been found to be in the 40 to 50 micro meter range indicated in Table I. It may be seen that the corresponding horizontal travel in micro meters from Table I is less than 0.2 micro meters. The range is very small and represents the horizontal motion, or scrub, which occurs between the free end of the parallelogram beam 30 and a test pad contact on a semiconductor device for vertical travels of the free end of the micro beam in the range of 40 to 50 micro meters. The parallelogram construction of the micro beam 30 of the present invention is the structure which restricts the horizontal travel of the micro beam free end. The importance of this restricted horizontal travel at the free end of the parallelogram beams 30 resides in the fact that semiconductor test pads are usually aluminum. Aluminum oxide grows on the pads. The aluminum is comparatively soft, while the oxide is hard. Typically the oxide is 1000 angstroms thick and the test pad underneath is 5 micro-meters (50,000 angstroms) thick. The test pad oxide layer must be penetrated by a contact (to be hereinafter described) on the end of the beam 30, but the aluminum pad must not be damaged. Sufficient contact pressure to penetrate the oxide will not damage the aluminum pad as long as there is very little horizontal travel of the contact at the end of the beam. The parallelogram beam functions to limit the horizontal travel or "scrub" as seen in Table I.

On the lower layer 31 of the parallelogram micro beam 30 as seen in FIG. 5, a conductive shielding layer 36 is laid down by vacuum deposition, sputtering or some other known process. Adjacent the shielding layer an insulating layer 37 is applied, the thickness of which is determined by the required circuit impedance and the mechanical pitch of the test pads. An electrically conducting layer 38 is applied adjacent the insulating layer 37, wherein the conducting layer 38 is formed by known methods into a plurality of separate conductors extending from the free end of each of the parallelogram beams 30 in individual conducting paths to ones of the vias 19. Consequently, when the test circuit contacts 21 are inserted through the vias 19 the lower ends 27 thereof are brought into pressure contact with the individual conductor paths formed from the conducting layer 38. As a consequence, a conducting path is completed from the tester upper contacts 23 on the shielded test circuit contacts 21 to the free ends of the parallelogram micro beams 30.

Subsequently, another insulating layer 39, similar to insulating layer 37 is applied adjacent to the individual conducting paths formed from layer 38 as seen in FIG. 5. Ultimately, a lower shielding layer 41 is applied on the assembly adjacent to the insulation layer 39, whereby the conducting paths in the layer 38 are shielded along the lengths thereof by the shielding layers 36 and 41 and shielding is also provided through the vias 19 by the shielding tube 24 surrounding the elongate conductors 22 extending therethrough. A contact bump 42 is formed on the end of the individual conducting paths in the layer 38 at the free ends of the cantilevered parallelogram beams 30.

Shielding which completely surrounds the conducting paths formed in conducting layer 38 is obtained through a process explained in conjunction with FIGS. 8A through 8F. Lateral sections through a cantilevered beam lower portion are seen in these Figures. The conductive shielding layer 36 is shown in FIG. 8A having insulating layer 37 attached to the undersurface thereof. Channels 37a are formed in layer 37 by known masking and etching techniques as seen in FIG. 8B. The channels 37a run from the free end of the cantilevered beam to the position of the vias 19 at the periphery of the assembly. The conducting layer 38 is deposited on the lower surface of insulation layer 37, filling the channels 37a and making contact with shielding layer 36 (FIG. 8C). Conducting layer 38 is masked and etched to form channels 38a which separate the signal conducting paths 38 from the remainder of conducting layer 38b as seen in FIG. 8D. The channels 38a run similarly to channels 37a. At this point in the process the contact bump 42 is formed on the free end of the cantilevered beams. Insulation layer 39 is deposited on the accessible side of layer 38, filling channels 38a in the process (FIG. 8E). Insulation layer 39 is masked and etched to produce channels 39a (FIG. 8F) which run similarly to channels 37a and 38a. Conducting layer 41 is deposited on the accessible side of insulation layer 39, filling channels 39a and contacting the 38b portion of conducting layer 38 through the channels, as also seen in FIG. 8F. As seen in FIGS. 8F and 5 the layer 41 ends prior to contacting contact bump 42. In this fashion conducting paths 38 are surrounded by conductive metal shielding which includes upper shielding layer 36, in contact with conducting layer portion 38b which is in turn in contact with lower shielding layer 41.

In the preferred embodiment a beam position sensor assembly, shown generally at 43 in FIG. 5 is positioned above the cantilevered micro beam assembly and spaced therefrom by a spacer 44. The spacer 44 is present for the purpose of providing some controlled amount of space between the cantilevered parallelogram beams 30 and the beam sensor assembly 43 so that the parallelogram micro beams maximum upward travel may be limited as seen in FIG. 5.

The beam sensor assembly 43 has an upper layer 46 with a gas flow input port 47 therethrough as indicated in FIG. 5. A plenum layer 48 is attached to the lower surface of the upper layer 46 having a plenum volume 49 therein bounded by a plenum end 51. A lower beam sensor layer 52 is attached to the lower surface of the sensor plenum layer 48 to enclose the lower end of the plenum 49. A series of outlet ports 53 extend through the lower beam sensor layer 52, wherein one such outlet port resides over the free end of each of the parallelogram micro beams 30. A gas conducting line 54 extends from the input port 47 at the plenum 49 to a differential pressure sensor 56. The differential pressure sensor is disposed between a pressure gas supply (not shown) and the plenum 49. When a gas flow is induced from the pressure supply through the plenum 49 and exhausted through the plurality of openings 53 the pressure sensor 56 registers a predetermined differential pressure level when the fingers or parallelogram beams 30 are in an initial position as seen in FIG. 5. When pressure is exerted on the contact bump 42 causing the parallelogram beam 30 to bend upwardly as seen in FIG. 5, a restriction to the outflow of gas through the plurality of openings 53 is imposed by the free ends of the micro beams and the pressure sensor 56 indicates a rise in pressure. A predetermined rise in pressure as indicated by the pressure sensor may be used to indicate when the parallelogram micro beams 30 are in an appropriate bending mode so that proper contact pressure is maintained between the contact bumps 42 and ones of the test pads on a semiconductor device under test and also to indicate that an appropriate bending mode in the parallelogram beams is obtained to limit the aforementioned scrubbing action between the contact bumps 42 and the semiconductor device test pads. It should be noted that each via 19 continues through the beam sensor assembly 43 in alignment with the vias through the parallelogram beam and conductor assembly so that the tester upper contacts 23 are available at the upper surface of the assembly of the beam position sensor and the parallelogram beams. It should further be noted that the thickness of the spacer layer 44 is selectable so that an appropriate mechanical stop may be provided by the lower surface of the layer 52 in the beam position sensor assembly 43 as seen in FIG. 5. The mechanical stop occurs when the upper surface of the parallelogram beam 30 collides with the lower surface of the layer 52.

The embodiment shown in FIGS. 5 and 8A–8F shows shielding of the signal conductor path from the contact bump 42 through the entire assembly of FIG. 5 to the tester upper contacts 23. The spacing of the layers of shielding from the conductor paths by the insulation layers 37 and 39 provide for the desired input and output impedance in the 50 to 100 ohm range as described hereinbefore.

Another preferred embodiment of the invention provides for a slightly lesser performance, but is useful in many testing applications. This latter embodiment is a modification of the lower silicon layer 31 as seen in FIG. 5 which may be described in conjunction with FIGS. 6A through 6F. With reference to FIG. 6A, the lower silicon layer 31 in the parallelogram beam assembly is shown having an upper layer of metal 57 sputtered thereon as well as a lower metal layer 58. A mask layer 59 is applied to the upper metal layer 57 by processes known to those of skill in this art. A lower layer 61 of photo resist is applied to the bottom metal layer 58 as seen in FIG. 6A. The photo resist layer 61 is masked, exposed to ultra violet light and the unexposed photo resist is washed away. A metal etch is performed thereby leaving the metal conductors as seen at 58a in FIG. 6B. A silicon etching step is performed to remove the silicon from layer 31 forming the micro beams as seen in FIG. 6C. An upper layer 62 of photo resist is applied to the exposed surface of the mask layer 59 in FIG. 6C. The photo resist layer 62 is exposed, and unexposed portions washed away, so that parts of the mask layer 59 are exposed. The exposed portions of the mask layer 59 are etched away by means known to those of skill in this art whereby conical voids are formed in the mask layer. The bases of the conical voids are adjacent the upper metal layer 57. This is best seen in FIG. 6D. The photo resist layer 62 is removed and metal is sputtered into the conical voids within mask layer 59 to form the contact bumps 42 seen in FIG. 6E. Subsequently a photo resist layer 63 is applied over the contact bumps 42 and the metal layer 57, the photo resist is exposed and undeveloped photo resist washed away so that the contact bumps 42 are protected from he ensuing etch. The metal layer 57 is then etched away between the contact bumps 42 so that the lower silicon layer 31 in the parallelogram micro beam assembly has separate lower fingers for the parallelogram beams as seen in FIG. 6F. The resulting lower parallelogram beam layer 31 is applied to the bottom surface of the parallelogram beam spacer layer 29 thereby having conductors 38 running along one surface thereof, the conductors 38 having been formed from the metal layer 57, and being terminated in the contact bumps 42 at the free end of each parallelogram beam. A ground plane layer, or shielding layer, is formed by the metal layer 58 and the metal extensions 58a on the fingers extending along the surface of the silicon layer 31 which is opposite to the surface carrying the conductors and the contact bumps 42. As a consequence, only one shielding layer 58 exists above the conductor layer from which the individual conductor paths 38 are fabricated from the metal layer 57.

With reference again to FIG. 5, the Figure to show the lesser performing embodiment would require modification to show the shielding layer 58 lying between the parallelogram micro beam spacer layer 29 and the lower layer 31, and also to show the conductor paths lying along the lower side of the lower layer 31. As a result, shielding exists for the conductor pads between the contact bumps 42 and the plurality of tester upper contacts 23, although it is less effective than the shielding as shown in the embodiment of FIG. 5. In this embodiment it is possible for about 40% more noise to be picked up in the conductors 38 than in the fully shielded embodiment of FIGS. 8A–8F.

With reference to FIGS. 7A through 7G, silicon layers are shown having patterns etched thereupon. These etched layers function to form the invention disclosed herein as follows. FIG. 7A shows the layer 46 of FIG. 5, having the holes 47, a central opening shown as opening 51 and the peripheral vias 19 therein. The thickness of the silicon wafer 48, FIG. 7B, is 1.5 mm. The thickness of the silicon wafer 46 of FIG. 7A is also 1.5 mm in the preferred embodiment. FIG. 7B shows plenum layer 48 having a central opening aligned with opening 51, peripheral vias 19 and the plenums 49 formed therein. Plenums 49 are positioned such that the holes 47 of FIG. 7A overlie them.

The lower layer 52 of the beam sensor assembly 43 is shown in FIG. 7C having the peripheral vias 19 and a central opening aligned with opening 51, and the plurality of holes 53 for communication with the plenum 49. The thickness of the silicon wafer 52 of FIG. 7C is 0.2 mm. The layers 46, 48 and 52 of FIGS. 7A through 7C are assembled as described hereinbefore in conjunction with FIG. 5 to form the beam sensor assembly 43.

The spacer layer 44 is shown in FIG. 7D wherein the central opening shown therein is given the item number 64. The edges of the opening 64 describe an opening which is larger than opening 51 so that when assembled with the layers of FIGS. 7E through 7G, the edges of the opening 64 substantially coincide with the root ends of the parallelogram micro beams 30. Vias 19 are also shown in the layer 44 of FIG. 7D in registration with the vias 19 of the silicon layers described hereinbefore. The thickness of the layer 44 is 50 micro meters in this embodiment. As mentioned hereinbefore the thickness of the silicon layer 44 may be selected to provide for a predetermined travel at the free end of the parallelogram micro beams 30.

With reference now to FIGS. 7E through 7G the three layers which constitute the body of the parallelogram beam assembly will be described. Layer 28 is shown in FIG. 7F having the peripheral vias 19 and an aligned central opening 51. A plurality of cantilevered fingers 66 are shown on the silicon disc 28 having lengths of about 0.5 centimeters and having free ends extending to the edge of the central opening 51. The thickness of the silicon wafer 28 is 50 micro meters in this embodiment. The cantilevered fingers are approximately 100 micro meters in width and are spaced on 125 micrometer centers. In a configuration made to illustrate the preferred embodiment, 25 such cantilevered fingers 66 were formed approaching opposite edges of the central opening 51. It should be noted that this apparatus is capable of having 40 micro meter wide beams on 50 micro meter centers for higher density semiconductor device test pad patterns. The micro beams can be located on any side of the opening 51. Lower parallelogram beam layer 31 is fabricated in the same fashion as upper parallelogram beam layer 28. The manner in which the lower silicon layer 31 is fabricated is shown for one embodiment in FIGS. 6A through 6F and for another embodiment in FIGS. 8A through 8F, as described hereinbefore. The contact bumps 42 are formed on the free end of the cantilevered fingers 66 as seen in FIG. 7G.

After the silicon wafer 28 has been fabricated as seen in FIG. 7F, the silicon wafer 29 of FIG. 7E is attached to one surface of the wafer 28, masked and etched so that the vias 19 extend therethrough, the end blocks 32 are formed thereon, and the portion of the disc as seen at 33 is removed to the edge 34 pictured in FIG. 5. The central opening which is aligned with opening 51, is also formed in the silicon wafer 29 while it is attached to the silicon wafer 28, as are the peripheral vias 19. Following the formation of the wafer 29 of FIG. 7E while attached to the upper parallelogram beam layer 28, the formed lower wafer 31 is attached to the accessible side of the wafer 29 to complete the construction of the parallelogram beam assembly containing the micro beams 30 extending to the edge of the opening 51. The wafers 28 and 31 are 0.2 milli meters thick and the spacer wafer 29 is 0.4 milli meters thick in the preferred embodiment. As mentioned hereinbefore, the wafers in FIGS. 7A through 7G are oriented in accordance with the flats 17 and 18 prior to imposing the etched patterns thereupon, so that the walls of the etched through openings are orthogonal to the 110 crystal plane constituting the upper and lower planar surfaces of the wafers.

In the embodiments disclosed herein it is envisioned that individual line drivers and receivers will be placed on the micro beam probe body for each of the conductor paths. Since the probe body is fabricated from silicon wafers, the line drivers and receivers will be deposited on the probe body by semiconductor circuit formation techniques well known to those of this art. Such drivers and receivers could also be attached as individual circuit chips. FIG. 8 shows one such driver or receiver containing an NPN transistor Q having a biasing voltage divider consisting of resistors R1 and R2 and having a terminal 67 for connection to accessible terminals from tester 11 and a terminal 68 for connection to individual ones of the conductor paths. The values and ratios of R1 and R2 vary as known to those of skill in the art according to whether the circuit of FIG. 8 is a driver or a receiver. Various versions of drivers and receivers may be utilized for formation on the micro beam probe silicon body. Such drivers and receivers may be conveniently placed on any of the aforedescribed silicon wafers in the layered micro beam probe assembly.

Although the best mode contemplated for carrying out the present invention has been herein shown and described, it will be apparent that modification and variation may be made without departing from what is regarded to be the subject matter of the invention.

What is claimed is:

1. A micro beam probe for positioning and electrically interfacing between a semiconductor tester and a semiconductor device to be tested, wherein the semiconductor device has a predetermined pattern of test pads thereon, and wherein the semiconductor tester has a plurality of accessible test circuit terminals, comprising a plurality of cantilevered parallelogram beams having free ends and fixed ends thereon, said free ends being disposed for motion in a direction toward and away from the semiconductor test pads upon bending of the parallelogram beams, a plurality of test pad contacts attached to said free ends and being arrayed in registration with the predetermined pattern of semiconductor test pads, a plurality of tester connection contacts for electrical connection to the plurality of accessible test circuit terminals, a plurality of electrical conductors extending between ones of said plurality of tester connection contacts and ones of said plurality of test pad contacts, means for shielding said plurality of electrical conductors, means for providing mechanical support for said plurality of electrical conductors, said means for shielding and said parallelogram beam fixed ends, and means for sensing a predetermined bending limit in said parallelogram beams in communication with a pressurized gas supply, comprising a gas plenum having an input orifice in communication with the pressurized gas supply, said gas plenum having a plurality of output orifices adjacent to and spaced from ones of said parallelogram beam free ends, and pressure sensing means in communication with said gas plenum input for sensing gas flow restriction indicative of proximity of said parallelogram beam free ends and therefore beam bending.

2. A micro beam probe as in claim 1, comprising beam stop means for limiting bending of said parallelogram beams in a direction away from the semiconductor test pads.

3. A micro beam probe as in claim 2 comprising means for selecting the position of said beam stop means whereby the bending limit of said parallelogram beams is set.

4. A micro beam probe as in claim 1 comprising means for selecting the initial position of said parallelogram beam free ends relative to said plenum output orifices.

5. A micro beam probe as in claim 1 wherein said means for providing mechanical support has an opening therein having edges defining said opening, and wherein said plurality of parallelogram free ends extend to at least a portion of said opening defining edges, whereby the semiconductor device pattern of test pads is visually aligned with said plurality of test pad contacts.

6. A micro beam test probe for interfacing a semiconductor tester having a plurality of accessible test terminals with a semiconductor device under test, the semiconductor device having a predetermined array of test pads, comprising beam assembly means having a plurality of silicon layers and having an opening therethrough, a plurality of cantilevered parallelogram beams on said beam assembly means having fixed beam ends and free beam ends, said free ends lying along the periphery of said beam assembly means opening, said cantilevered parallelogram beams comprising silicon wafer layers including an upper layer, a lower layer, a fixed end spacer and a free end spacer, beam sensor means overlying said beam assembly means for sensing bending of said cantilevered parallelogram beams toward said beam sensor means from an initial position, said beam sensor means having an opening therethrough aligned with said beam assembly means opening, a plurality of tester contacts mounted in said beam assembly means for connection with the accessible test terminals, a plurality of test pad contacts attached to said cantilevered parallelogram beam lower layer free ends in a pattern which is in registration with the predetermined array of test pads, a plurality of conductor means for electrically connecting ones of said test pad contacts with ones of said tester contacts, and shielding means extending along said conductor means.

7. A micro beam probe as in claim 6, comprising a plurality of semiconductor conducting path drivers formed on ones of said beam assembly means plurality of silicon layers and connected to ones of said plurality of conductor means.

8. A micro beam test probe as in claim 6, comprising a spacer disposed between said beam assembly means and said beam sensor means, whereby said beam sensor means is spaced from said parallelogram beam free ends and provides a mechanical bending stop for said parallelogram beams.

9. A micro beam test probe as in claim 6 wherein said plurality of tester contacts, comprises an elongate electrical conductor extending through said beam assembly means and said beam sensor means, a metallic sleeve surrounding said electrical conductor, insulation mans disposed between said electrical conductor and said metallic sleeve, and means on one end of said electrical conductor for providing electrical contact with said conductor means, whereby electrical contact and shielding is provided between the accessible test terminals and said conductor means.

10. A micro beam test probe for interfacing a semiconductor tester having a plurality of accessible test circuit terminals with a semiconductor device under test having a predetermined array of test pads, comprising a probe body having substantially planar upper and lower surfaces and an opening through said planar surfaces, said probe body comprising a plurality of silicon wafer layers, a plurality of cantilevered beams, said plurality of cantilevered beams comprising silicon beam upper and lower layers extending from said corresponding probe body upper and lower surfaces and having fixed ends attached to said probe body and free ends extending to the edge of said opening, beam end means connecting said beam upper and lower layers at said free ends said cantilevered beams having a void between said silicon beam upper and lower layers extending from said beam end means to said fixed ends, a plurality of test circuit contacts for electrical connection to the accessible test circuit terminals, a plurality of test pad contacts on said beam lower layer at the free ends of said plurality of cantilevered beams, said plurality of test pad contacts being arranged in a pattern in registration with the predetermined array of test pads, and a plurality of conductor paths extending between ones of said plurality of test circuit contacts and ones of said plurality of test pad contacts.

11. A micro beam test probe as in claim 10, comprising a gas plenum, means for communicating said gas plenum with a pressurized gas supply, and pressure sensing means disposed between said gas plenum and the pressurized gas supply, said gas plenum having ones of a plurality of orifices proximate to and spaced from each of said plurality of cantilevered beam free ends, whereby proximity of said free ends to said orifices and therefore beam bending modes are sensed by said pressure sensing means.

12. A micro beam test probe as in claim 10 comprising shielding means surrounding said plurality of conductor paths, wherein ones of said plurality of test circuit contacts comprise an electrical conductor extending through said probe body from said upper to said lower surfaces, a metallic sleeve surrounding said electrical conductor, insulation means disposed between said electrical conductor and said metallic sleeve, and means on said electrical conductor at said probe body lower surface for electrically contacting ones of said plurality of conductor paths, whereby an electrical path and shielding thereof is provided for test signals between said test pad contacts and the accessible test circuit terminals.

13. The micro beam test probe of claim 10 wherein said plurality of conducting paths comprise a plurality of semiconductor conductor path drivers formed on ones of said plurality of silicon wafer layers on said probe body.

14. The micro beam test probe of claim 13 wherein said plurality of conducting paths further comprise a plurality of semiconductor conductor path receivers formed on said probe body.

15. A method of fabricating a micro beam probe for interfacing a semiconductor test circuit having accessible test circuit contacts with a semiconductor device having a predetermined array of test pads, comprising the steps of locating the (110) plane in a silicon crystal, locating the ($\bar{1}$11) plane in the silicon crystal, cutting a major orientation flat on the edge of the crystal along the ($\bar{1}$11) plane, locating the (1$\bar{1}$1) plane in the silicon wafers, cutting a minor orientation flat on the edge of the crystal along the (1$\bar{1}$1) plane, cutting wafers from the crystal with the cut surfaces parallel to the (110) plane, masking and etching registered patterns on an upper and a lower wafer in predetermined orientation with the orientation flats, whereby etched walls are orthogonal to the (110) plane, the patterns including a central opening, a plurality of cantilevered beams having free ends along the edge of the opening, and a plurality of vias proximate to the wafer peripheries, attaching a spacer wafer to one side of the etched upper wafer with the orientation flats in alignment, masking and etching an opening in the spacer wafer in registration with the central opening and removing all of the spacer wafer overlying the cantilevered beams except a separate end block at each beam free end, depositing a metal on the lower side of the lower wafer masking and etching signal conductor paths in the deposited metal extending from the free ends of the cantilevered beams to ones of the peripheral vias, forming contact bumps on the free ends of the cantilevered beams, aligning the cantilevered beams on the upper and lower wafers and attaching the upper side of the lower wafer to the accessible side of the etched spacer wafer, forming test circuit terminals adapted to receive the test circuit contacts, and connecting the signal conductor paths through the vias with the test circuit terminals.

16. The method of claim 15 wherein the step of forming contact bumps comprises the steps of depositing a mask layer over the signal conductor paths on the free ends of the cantilevered beams, masking and etching the mask layer to form voids overlying the signal conductor paths at the free ends of the cantilevered beams, depositing metal in the voids, whereby metal contact bumps are formed on the free ends of the beams, and removing the mask layer.

17. The method of claim 15 comprising the step of shielding the signal conductor paths and the vias.

18. The method of claim 15 comprising the step of fabricating semiconductor driver circuits in the cut silicon wafers for the signal conductor paths.

19. The method of claim 18 comprising the step of fabricating semiconductor receiver circuits in the cut silicon wafers in communication with ones of said semiconductor driver circuits.

* * * * *